(12) United States Patent
De Jager

(10) Patent No.: US 7,061,581 B1
(45) Date of Patent: Jun. 13, 2006

(54) LITHOGRAPHIC APPARATUS AND DEVICE MANUFACTURING METHOD

(75) Inventor: Pieter Willem Herman De Jager, Rotterdam (NL)

(73) Assignee: ASML Netherlands B.V. (NL)

( * ) Notice: Subject to any disclaimer, the term of this patent is extended or adjusted under 35 U.S.C. 154(b) by 4 days.

(21) Appl. No.: 10/994,185

(22) Filed: Nov. 22, 2004

(51) Int. Cl.
G03B 27/42 (2006.01)
G03B 27/54 (2006.01)

(52) U.S. Cl. .......................... 355/53; 355/67
(58) Field of Classification Search ................ 355/53, 355/55, 67–71; 430/5, 20, 311; 356/399–401; 359/619–626
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,617,211 A * | 4/1997 | Nara et al. ................ | 356/401 |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,238,852 B1 * | 5/2001 | Klosner ................ | 430/396 |
| 6,424,404 B1 * | 7/2002 | Johnson ................ | 355/44 |
| 6,687,041 B1 | 2/2004 | Sandstrom | |
| 6,747,783 B1 | 6/2004 | Sandstrom | |
| 6,795,169 B1 | 9/2004 | Tanaka et al. | |
| 6,806,897 B1 | 10/2004 | Kataoka et al. | |
| 6,811,953 B1 | 11/2004 | Hatada et al. | |
| 6,967,711 B1 * | 11/2005 | Gui ................ | 355/67 |
| 2004/0041104 A1 | 3/2004 | Liebregts et al. | |
| 2004/0130561 A1 | 7/2004 | Jain | |
| 2005/0007572 A1 | 1/2005 | George et al. | |

FOREIGN PATENT DOCUMENTS

| | | |
|---|---|---|
| WO | WO 98/33096 | 7/1998 |
| WO | WO 98/38597 | 9/1998 |

* cited by examiner

*Primary Examiner*—Henry Hung Nguyen
(74) *Attorney, Agent, or Firm*—Sterne, Kessler, Goldstein & Fox PLLC

(57) ABSTRACT

A lithographic apparatus including an illumination system for supplying a plurality of beams of radiation, an array of individually controllable elements for imparting to each beam a pattern in its cross section, a substrate table for supporting a substrate, and projection systems for projecting the patterned beams onto the substrate. A displacement system causes relative displacement between the substrate and the projection systems such that the projections beams are scanned across the substrate in a predetermined scanning direction. Each projection system includes an array of lenses arranged such that each lens in the array directs a respective part of the respective beam towards a respective target area on the substrate. The projection systems are arranged in groups such that lenses in the arrays of different groups direct parts of different beams to different target areas of the substrate that are aligned in the scanning direction. The groups of projection systems are spaced apart in the scanning direction and each group directs beams towards target areas of the substrate that are contiguous and occupy a respective contiguous section of the substrate. Thus different sections of the substrate are exposed by different groups of projection systems, enabling high through put with relatively low substrate displacement speeds and relatively small substrate displacements.

22 Claims, 10 Drawing Sheets

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, can be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means can comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction.

A lithographic apparatus is known in which a pattern is imparted to a beam by an array of individually controllable elements. Rather than relying upon a preformed mask (also referred to as a reticle) to impart a pattern to a beam, control signals are delivered to the array of controllable elements to control the state of those elements to pattern the beam. This is generally referred to as "maskless" given that it relies upon individually controllable elements rather than a mask to impart the necessary pattern to the beam. A maskless lithographic apparatus can be used to expose relatively large area substrates, for example substrates to be used as flat panel displays. The panels are exposed in a single pass beneath an array of projection systems, each of which is provided with its own patterning system incorporating an array of individually controllable elements. As the substrate is displaced relative to the projection systems, it is necessary to change the state of individual elements in the arrays of controllable elements so as to change the projected patterns. The rate at which the state of the individual elements can be changed, generally referred to as the update rate, is limited and this imposes an upper limit on the maximum speed at which a substrate can be displaced relative to the projection systems. The speed of displacement determines the maximum throughput of the apparatus, and therefore it is desirable to be able to increase the speed of displacement.

It is possible to increase the substrate displacement speed by increasing the number of projection systems devoted to the exposure of a single track of pixels in the substrate scanning direction. For example, a substrate displacement speed can be doubled if two projection systems are arranged in series in the scanning direction. With such an arrangement each adjacent pair of pixels in the scanning direction can be exposed by a respective one of the two projection systems.

The substrate displacement speed can be further improved by adding further rows of projection systems. Three rows of projection systems trebling the maximum speed and four rows quadrupling the maximum speed. Increasing the substrate speed brings with it its own problems however in terms of maintaining appropriate speed control and achieving the necessary acceleration and deceleration of the substrate before and after scanning of the substrate.

Furthermore, adding extra rows of projection systems increases the overall distance that a substrate has to be displaced to achieve a full scan. For example, a row of projection systems capable of exposing the full width (perpendicular to the scanning direction) of the substrate is typically of the order of 100 millimeters deep in the scanning direction and therefore, given a single row of projection systems and a substrate 2 meters long in the scanning direction, a total scan range of 2.1 meters is required. Adding a second row of projection systems increases the scan range to 2.2 meters and so on.

However, adding additional rows of projection systems does not result in a proportionate increase in throughput. This is because as the total area that has to be exposed is also larger, adding one projection system increases the total area by the area of that projection system. In addition, adding rows of projection systems also increases the physical footprint of the apparatus.

Therefore, what is needed is a system and method that increases throughput in a maskless lithography system.

SUMMARY OF THE INVENTION

According to an embodiment of the present invention, there is provided a lithographic apparatus comprising an illumination system, an array of individually controllable elements, projection systems, a displacement system. The illumination system supplies a plurality of beams of radiation. The array of individually controllable elements imparting to each beam a pattern in its cross section. The projection systems projecting the patterned beams onto a substrate. The displacement system causes relative displacement between the substrate and the projection systems, such that the beams are scanned across the substrate in a predetermined scanning direction. Each projection system comprises an array of lenses arranged such that each lens in the array directs a respective part of the respective beam towards a respective target area on the substrate. The projection systems are arranged in groups, such that lenses in the arrays of different groups direct parts of different beams to different target areas of the substrate that are aligned in the scanning direction. The groups of projection systems are spaced apart in the scanning direction, such that each group scans beams across a respective area of the substrate as the substrate and projection systems are displaced relative to each other. The respective areas scanned by beams from groups that are adjacent to each other in the scanning direction being contiguous.

According to another embodiment of the present invention, there is provided a device manufacturing method comprising the following steps. Providing beams of radiation using an illumination system. Using arrays of individually controllable elements to impart to each beam a pattern in its cross section. Projecting the patterned beams onto a substrate. Displacing the substrate relative to the patterned beams, such that the beams are scanned across the substrate in a predetermined scanning direction. Each beam is directed towards a substrate by a respective array of lenses arranged such that each lens in the array directs a respective part of the respective beam towards a respective target area on the substrate. The projection systems are arranged in groups, such that lenses in the arrays of different groups direct parts of different beams to different areas of the substrate that are aligned in the scanning direction. The groups are spaced apart in the scanning direction, such that each group scans beams across areas of the substrate as the substrate and projection systems are displaced relative to each other. The respective areas scanned by beams from groups that are adjacent to each other in the scanning direction being contiguous.

In one example, it is possible to increase the throughput of lithographic apparatus without increasing the substrate displacement speed and with a reduction in scan range. This can be achieved because essentially contiguous sections of the substrate in the scanning direction are exposed by different arrays of projection devices.

As discussed above, to expose a two meter long substrate using a single array of projection devices that is 100 mm deep in the scanning direction would require a scan length of 2.1 meters. Simply adding a second array of projection devices would increase the scan range to 2.2 meters. In contrast, in one example of the present invention a second row of projection devices spaced apart with a pitch of one meter enables the full two meter length of the substrate to be exposed with a scan range of as little as 1.05 meters.

In other examples, more than two rows of projection devices can be provided. For example, three rows of projection devices could be provided equally spaced apart in the scanning direction. Alternatively, four rows of projection devices could be provided, either equally spaced apart, or in two groups of two rows with the two groups spaced apart in the scan direction. As a result relatively compact apparatus can achieve very high throughputs without requiring high speed substrate displacement.

In one example, each group can be arranged to expose a generally rectangular area of the substrate with the groups spaced apart with a pitch of L/N, where L is the length of the substrate to be exposed and N is the number of groups. Alternatively, each of the contiguous areas can have a generally rectangular main portion and at least one end portion extending in the scanning direction from the main portion, the end portions of contiguous areas having a saw-toothed shape with the teeth of one end section overlapping the teeth of the contiguous end section. The end sections can have a length in the scanning direction equal to the length in the scanning direction of each group of projection systems. With such an arrangement, N groups of projection systems can be distributed in the scanning direction with a pitch of (L+1)/N, where 1 is the length in the scanning direction of one group.

In one example, the substrate is displaced relative to stationary projection systems. Each lens array can project spots of light that are capable of exposing tracks on the surface of the substrate, the tracks exposed by one array being contiguous so that the full width (perpendicular to the scanning direction) of the substrate can be exposed in a single pass.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 2:
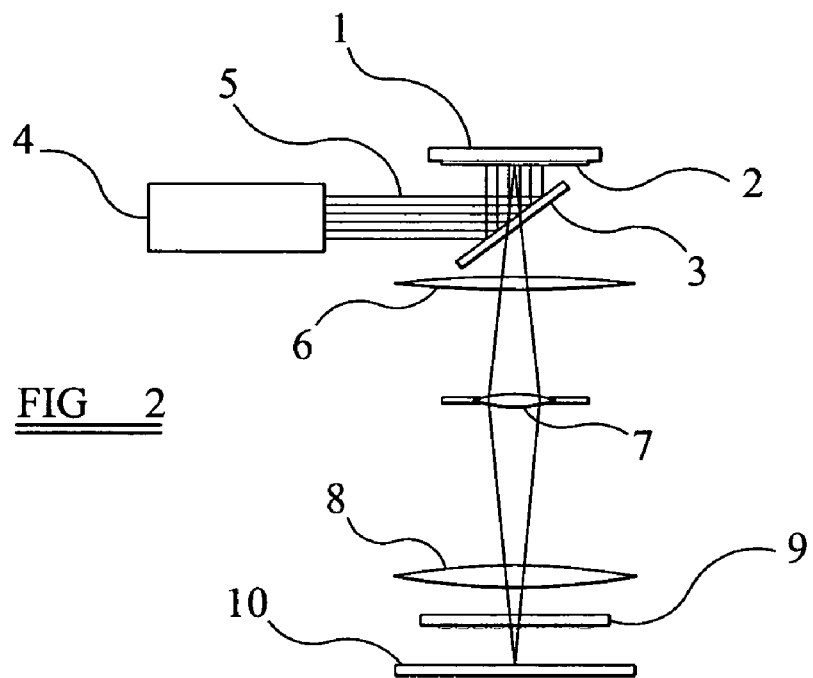
FIGS. 2 and 3 show components of lithographic projection apparatus incorporating arrays of lenses, each of which is arranged to project a spot of radiation onto the substrate, according to various embodiments of the present invention.
Figure 3:
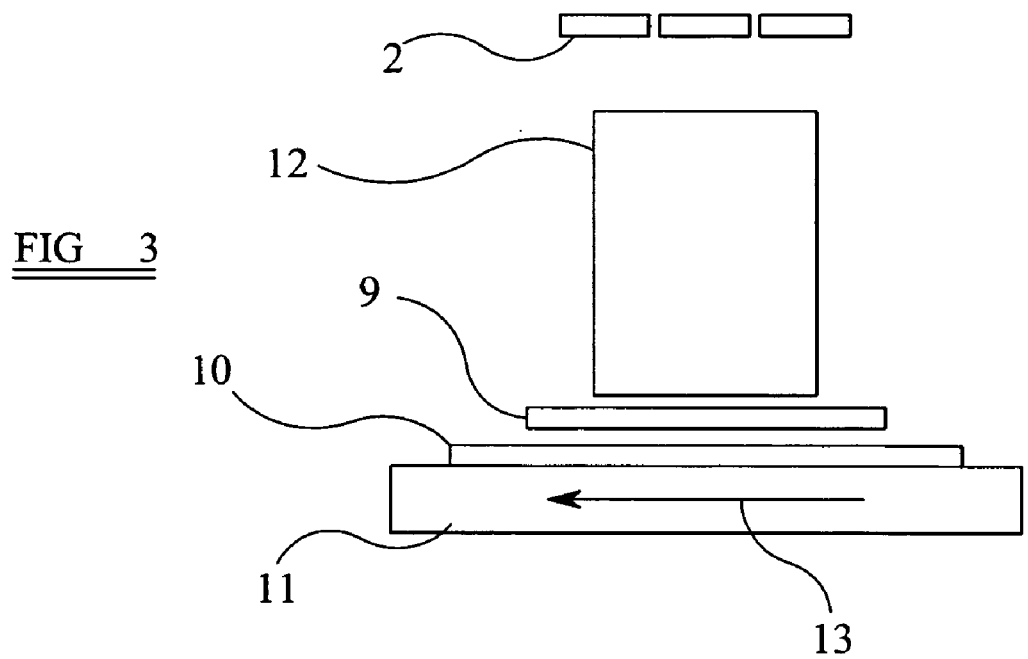
Figure 6:
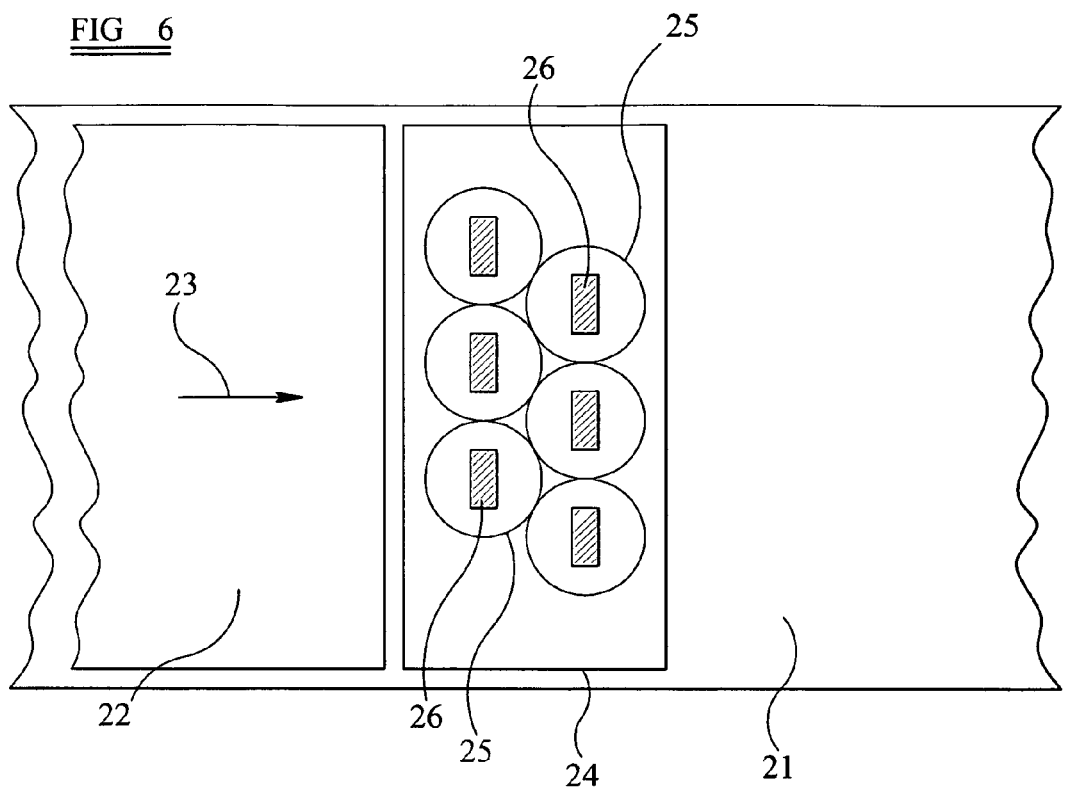

FIG. 6 schematically represents an apparatus for exposing a substrate in a single pass of the substrate beneath an array of optical columns each of which comprises components as illustrated in FIGS. 2 and 3, according to one embodiment of the present invention.

Figure 7:
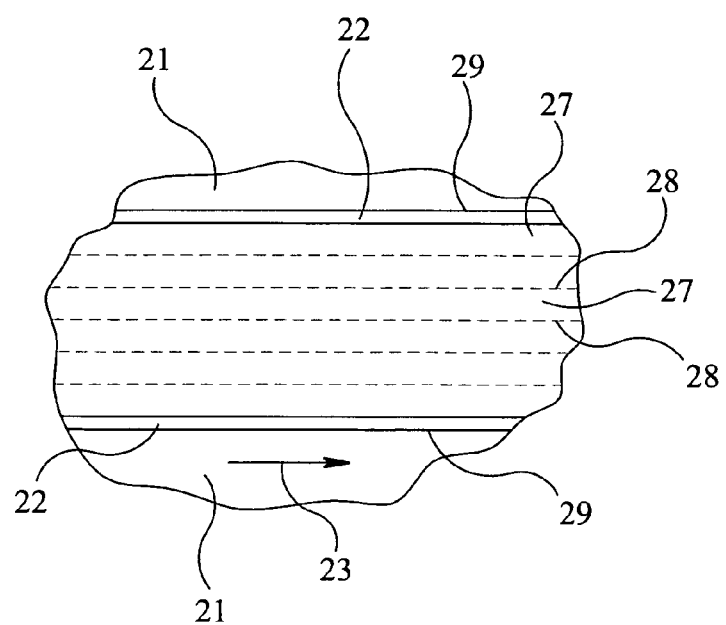

FIG. 7 schematically represents the different areas of the substrate which can be illuminated by each of the optical columns shown in FIG. 6, according to one embodiment of the present invention.

Figure 8:
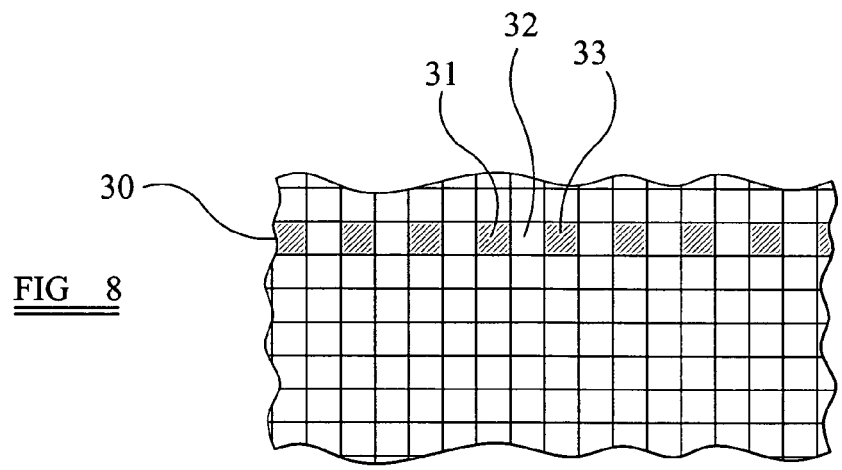

FIG. 8 schematically represents a pattern which it can be desired to expose on a substrate using the apparatus of FIG. 6, according to one embodiment of the present invention.

Figure 9:
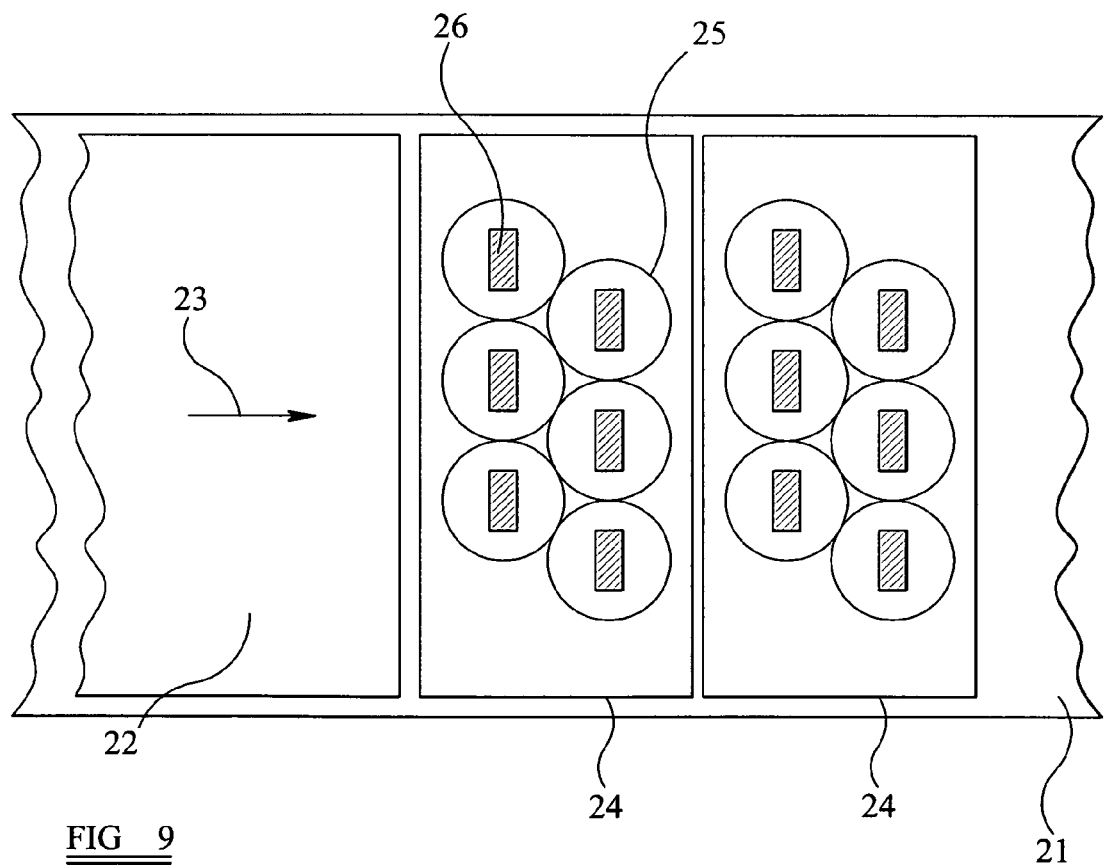

FIG. 9 schematically represents a position of two arrays of optical columns each of the type shown in FIG. 6, according to one embodiment of the present invention.

Figure 10:
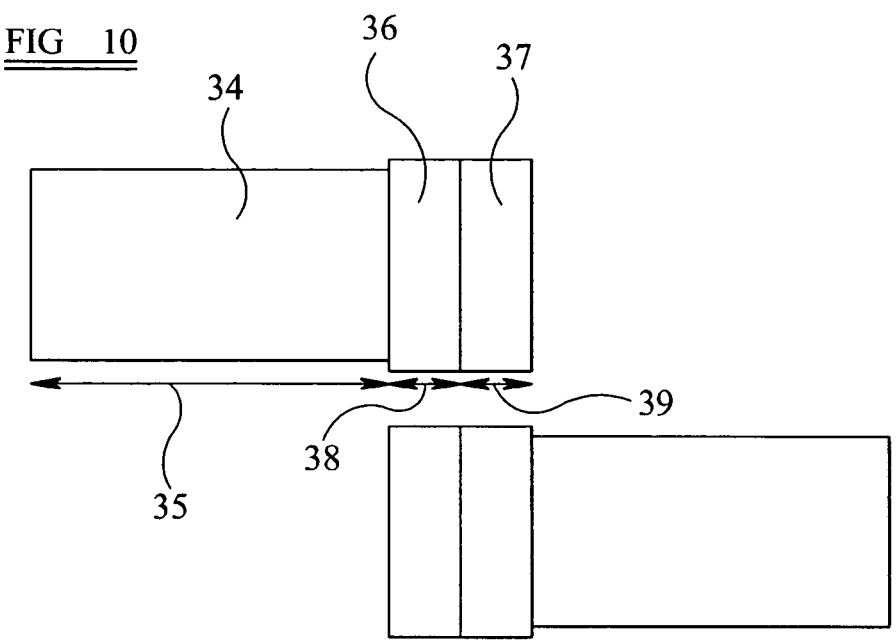

FIG. 10 schematically represents a scan range to expose a full substrate using the apparatus of FIG. 9, according to one embodiment of the present invention.

Figure 11:
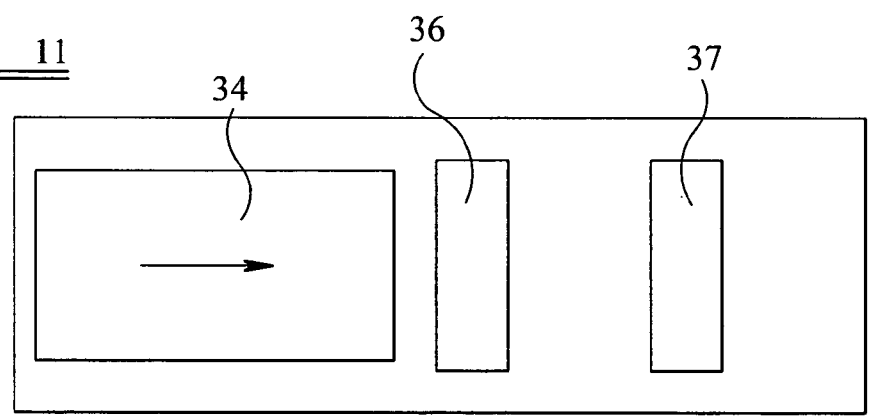

FIG. 11 schematically represents one embodiment of the present invention incorporating two groups of optical columns with the groups of optical columns being spaced apart in the scanning direction.

Figure 12:
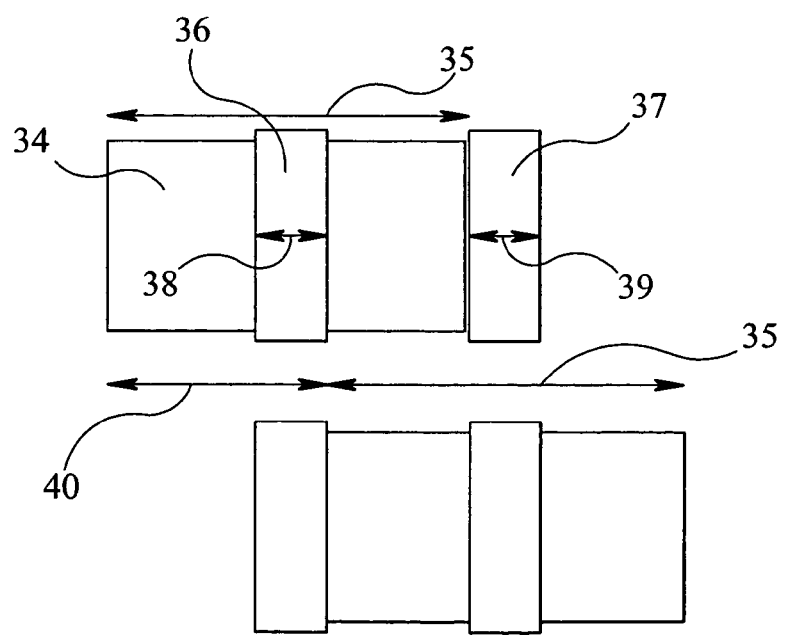

FIG. 12 schematically represents a scan range required to expose a full substrate using the apparatus of FIG. 11, according to one embodiment of the present invention.

Figure 13:
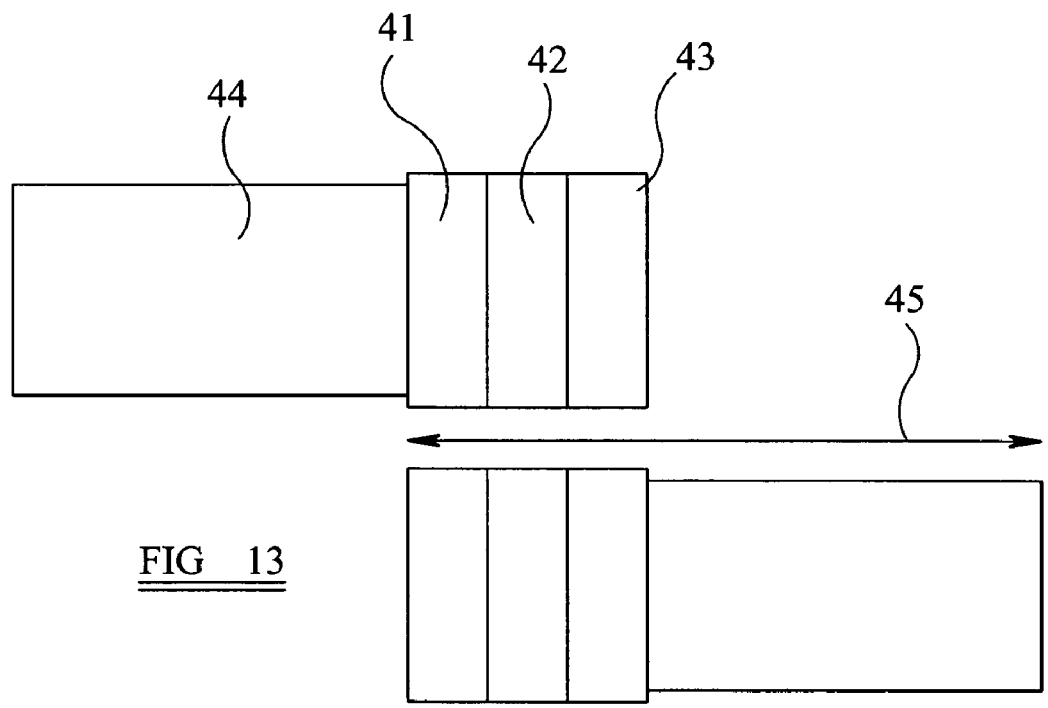

FIG. 13 schematically represents a scan range required to expose a full substrate using three groups of optical columns that are juxtaposed, according to one embodiment of the present invention.

Figure 14:
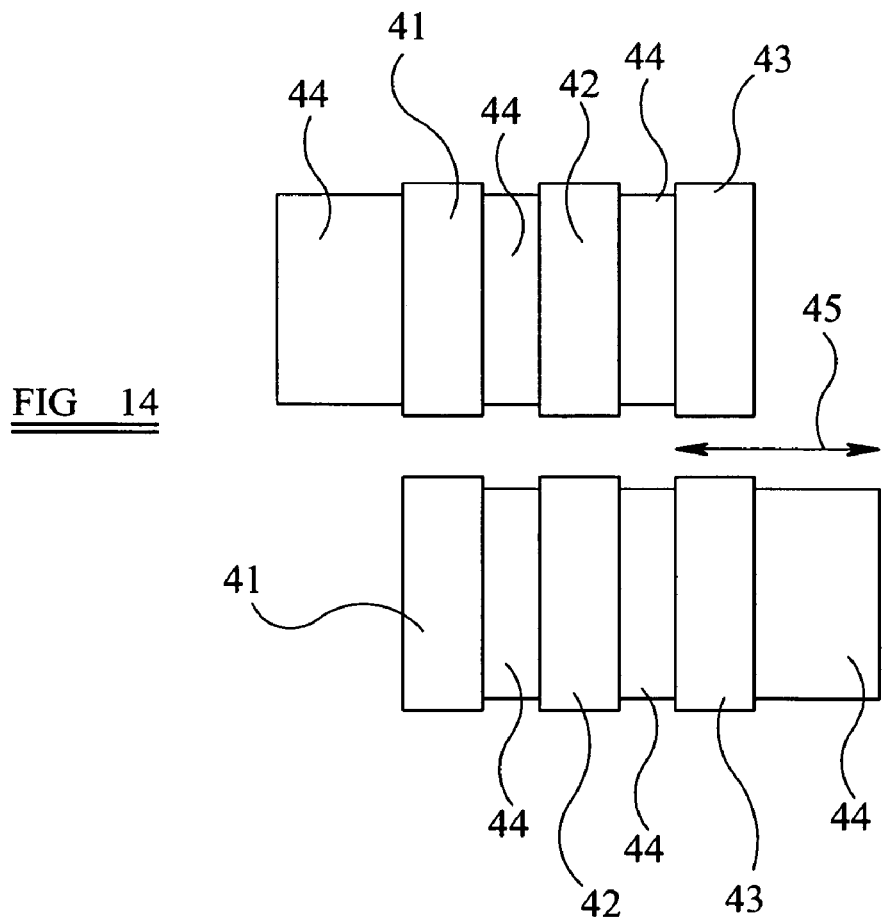

FIG. 14 schematically represents a scan range required to expose the full substrate using three groups of optical columns with the three groups being spaced apart in the scan direction, according to one embodiment of the present invention.

Figure 15:
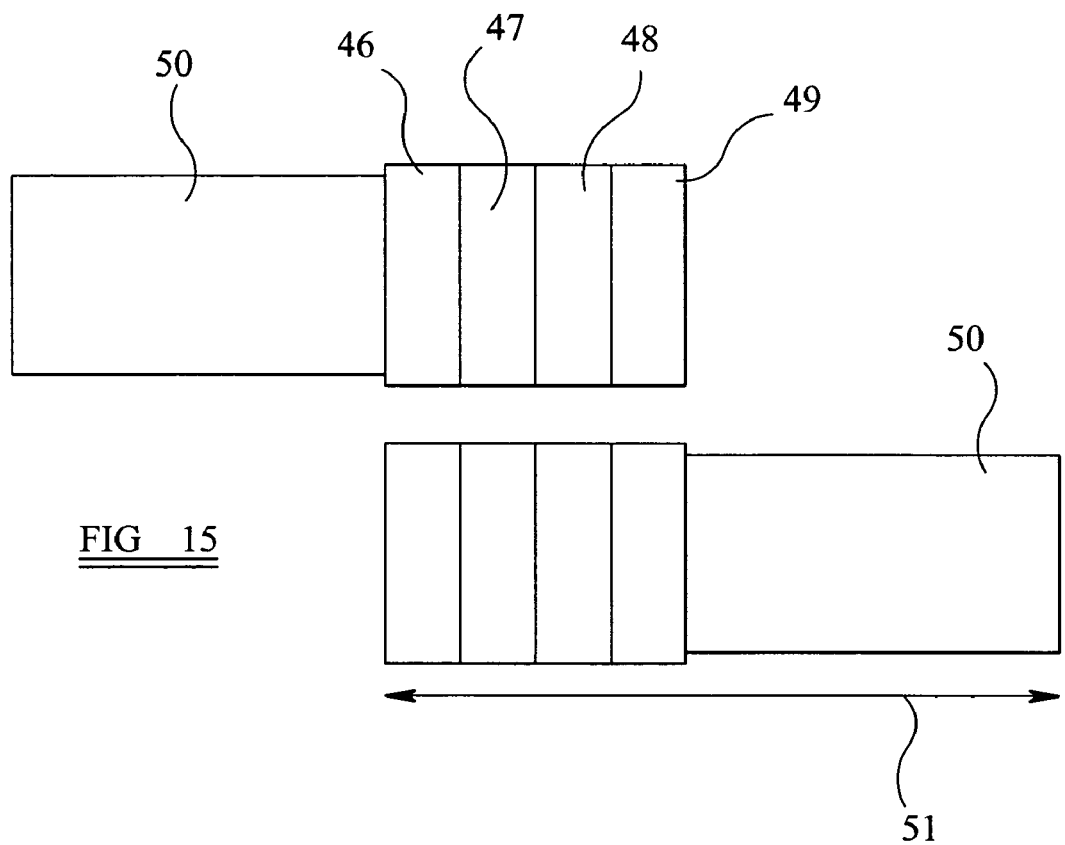

FIG. 15 schematically represents a scan range required to expose a full substrate using four groups of optical columns, according to one embodiment of the present invention.

Figure 16:
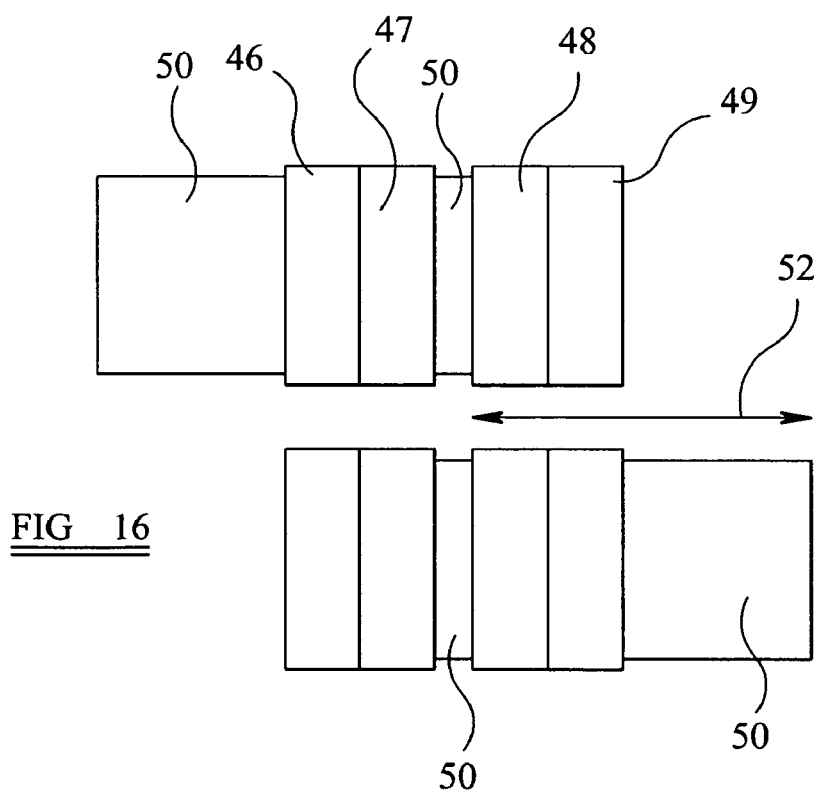

FIG. 16 schematically represents a scan range required to expose a full substrate using an apparatus in which four groups of optical columns are provided, the four groups being arranged in two pairs spaced apart in the scan direction, according to one embodiment of the present invention.

Figure 17:
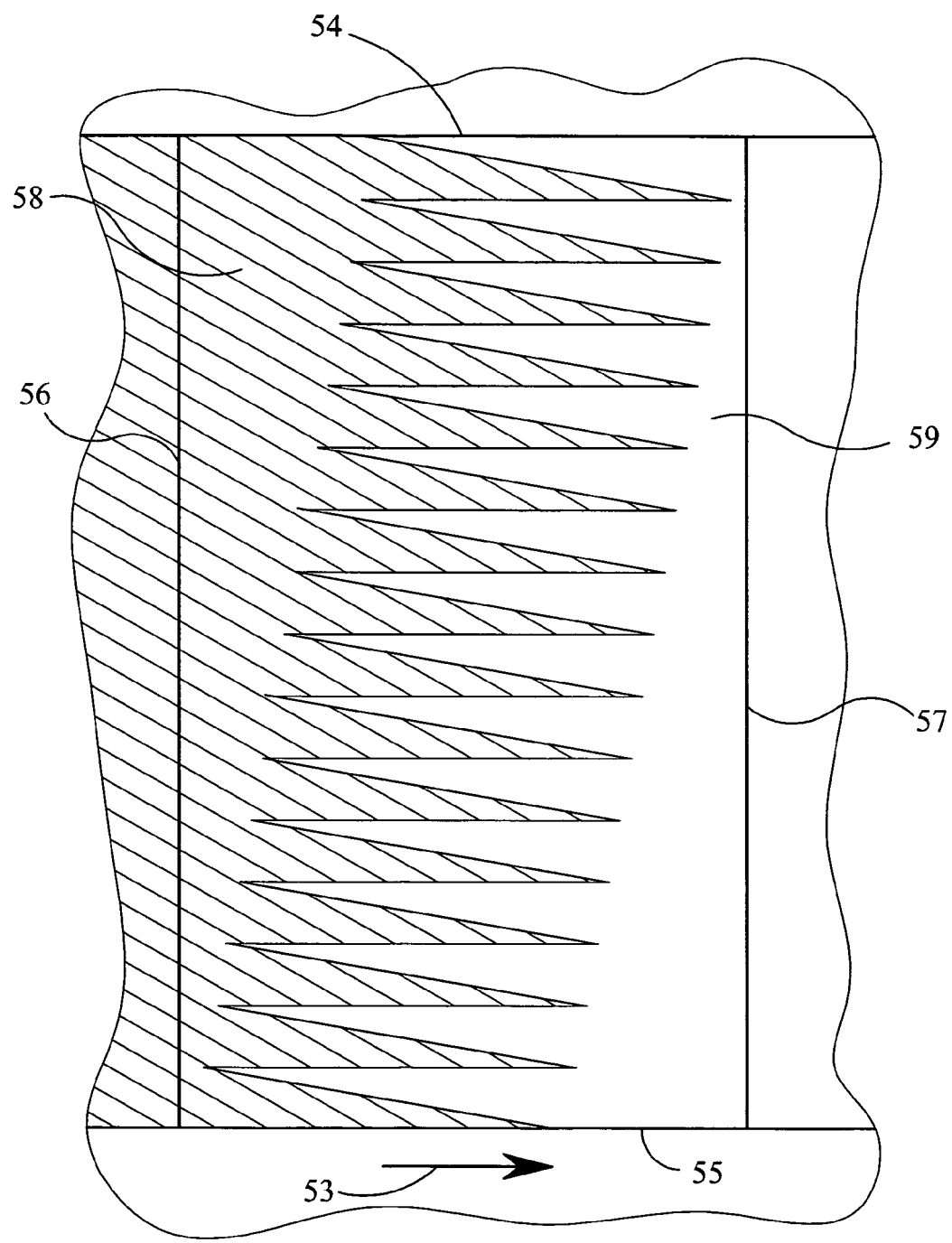

FIG. 17 illustrates a saw-toothed boundary between areas of a substrate exposed by adjacent projection systems, according to one embodiment of the present invention.

Figure 18:
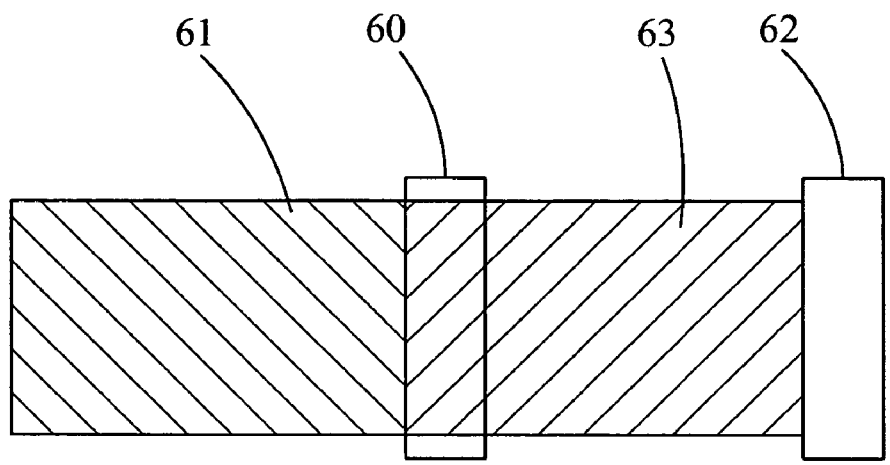
Figure 19:
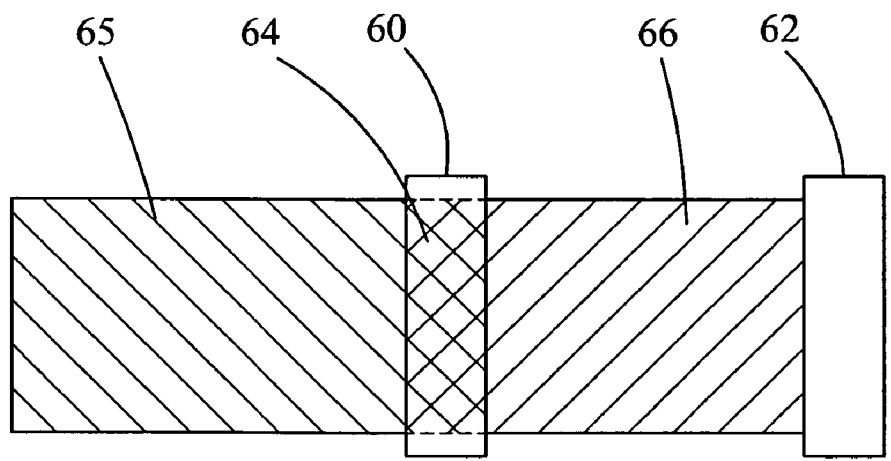

FIGS. 18 and 19 illustrate adopting a boundary as illustrated in FIG. 17, according to embodiments of the present invention.

DETAILED DESCRIPTION OF THE EMBODIMENTS

Overview and Terminology

Although specific reference can be made in this text to the use of lithographic apparatus in the manufacture of integrated circuits (ICs), it should be understood that the lithographic apparatus described herein can have other applications, such as the manufacture of integrated optical systems, guidance and detection patterns for magnetic domain memories, flat panel displays, thin-film magnetic heads, micro and macro fluidic devices, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (e.g., a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array can comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements can differ substantially from the pattern eventually transferred to a layer of or on the substrate. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Although specific reference can be made in this text to the use of lithographic apparatus in the manufacture of ICs, it should be understood that the lithographic apparatus described herein can have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g., having a wavelength in the range of 5–20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

The illumination system can also encompass various types of optical components, including refractive, reflective, and catadioptric optical components for directing, shaping, or controlling the beam of radiation, and such components can also be referred to below, collectively or singularly, as a "lens."

The lithographic apparatus can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

The lithographic apparatus can also be of a type wherein the substrate is immersed in a liquid having a relatively high refractive index (e.g., water), so as to fill a space between the final element of the projection system and the substrate. Immersion liquids can also be applied to other spaces in the lithographic apparatus, for example, between the substrate and the first element of the projection system. Immersion techniques are well known in the art for increasing the numerical aperture of projection systems.

Further, the apparatus can be provided with a fluid processing cell to allow interactions between a fluid and irradiated parts of the substrate (e.g., to selectively attach chemicals to the substrate or to selectively modify the surface structure of the substrate).

Lithographic Projection Apparatus

Figure 1:
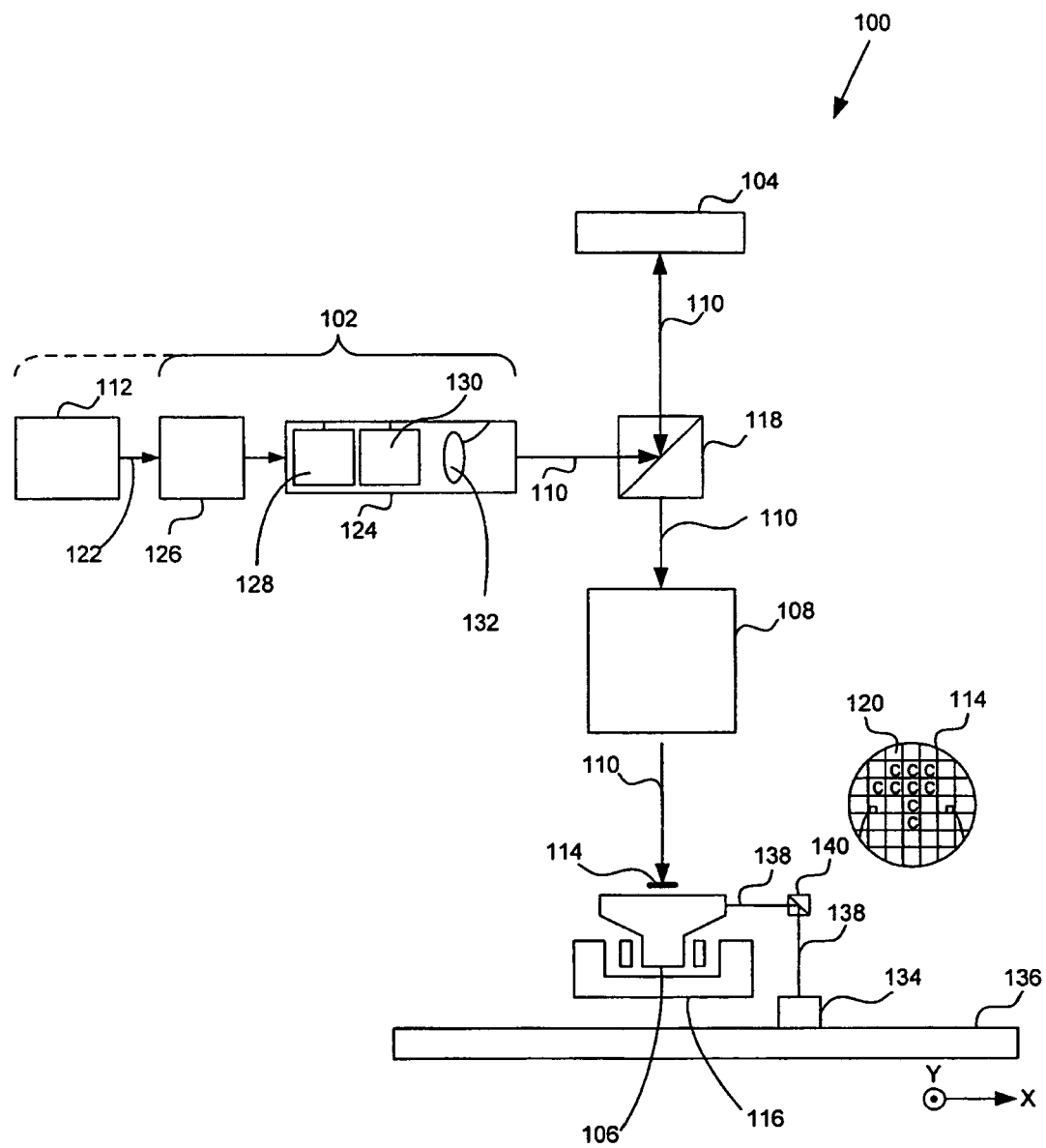
FIG. 1 depicts a lithographic apparatus, according to one embodiment of the present invention.

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or $CaF_2$ lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander, for example. Illuminator 124 can comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, beam 110 impinging on the array of individually controllable elements 104 has a desired uniformity and intensity distribution in its cross section.

It should be noted, with regard to FIG. 1, that source 112 can be within the housing of lithographic projection apparatus 100 (as is often the case when source 112 is a mercury lamp, for example). In alternative embodiments, source 112 can also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 6 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use can also be employed.

FIGS. 2 and 3 show components of lithographic projection apparatus incorporating arrays of lenses, each of which is arranged to project a spot of radiation onto the substrate, according to various embodiments of the present invention.

Referring now to FIG. 2, the apparatus shown comprises a contrast device 1, an underside surface of which supports a two dimensional array of elements 2. Each element 2 in the array can be selectively controlled to act either as an absorber or reflector of radiation. A beam splitter 3 is positioned beneath contrast device 1. An illumination source 4 directs a beam of radiation 5 towards beam splitter 3. Beam of radiation 5 is reflected onto the lower surface of contrast device 1. One of elements 2 of contrast device 1 is shown as reflecting a component part of beam 5 back through beam splitter 3 and projection optics defined by lenses 6, 7, and 8. A lowermost lens 8 is a field lens that produces a substantially telecentric beam, which is directed towards a microlens array 9. Microlens array 9 comprises a two dimensional array of small lenses each of which is arranged so as to focus light incident upon it onto an upper surface of a substrate 10. Thus, for each of elements 2 in contrast device 1 that acts as a mirror, a respective one of the lenses in microlens array 9 is illuminated, and a respective spot of light is projected by that lens in microlens array 9 onto the upper surface of substrate 10.

Referring to FIG. 3, this is an alternative representation of components show in FIG. 2. In FIG. 3, substrate 10 is shown supported on a substrate table 11 beneath microlens array 9. Projection optics are represented by a simple rectangle 12. Three contrast elements 2 of contrast device 1 of FIG. 2 are shown above projection optics 12. In this embodiment, substrate table 11 is moved in a linear manner in a direction of arrow 13 beneath microlens array 9. In an alternative arrangement, substrate 10 can be moved in a linear manner on a stationary table 11.

Figure 4:
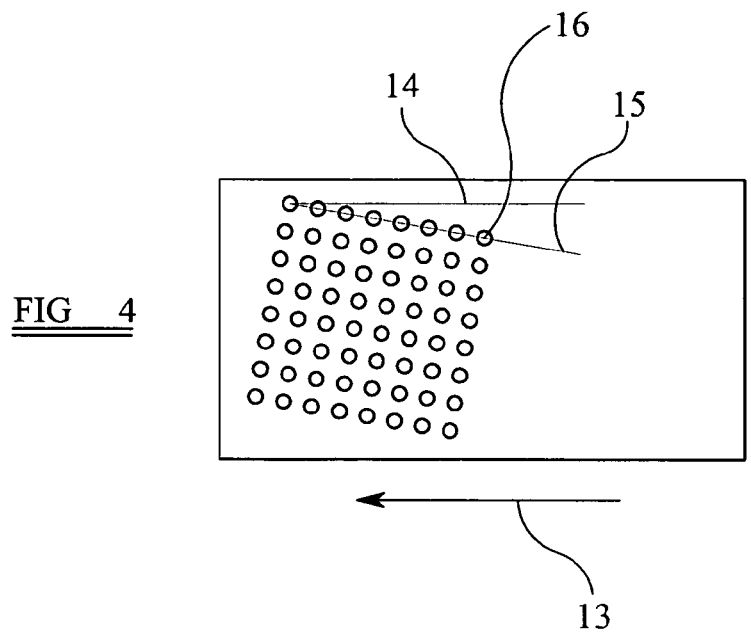
FIGS. 4 and 5 show disposition of spots of radiation projected by a lens arrays, according to various embodiments of the present invention.
Figure 5:
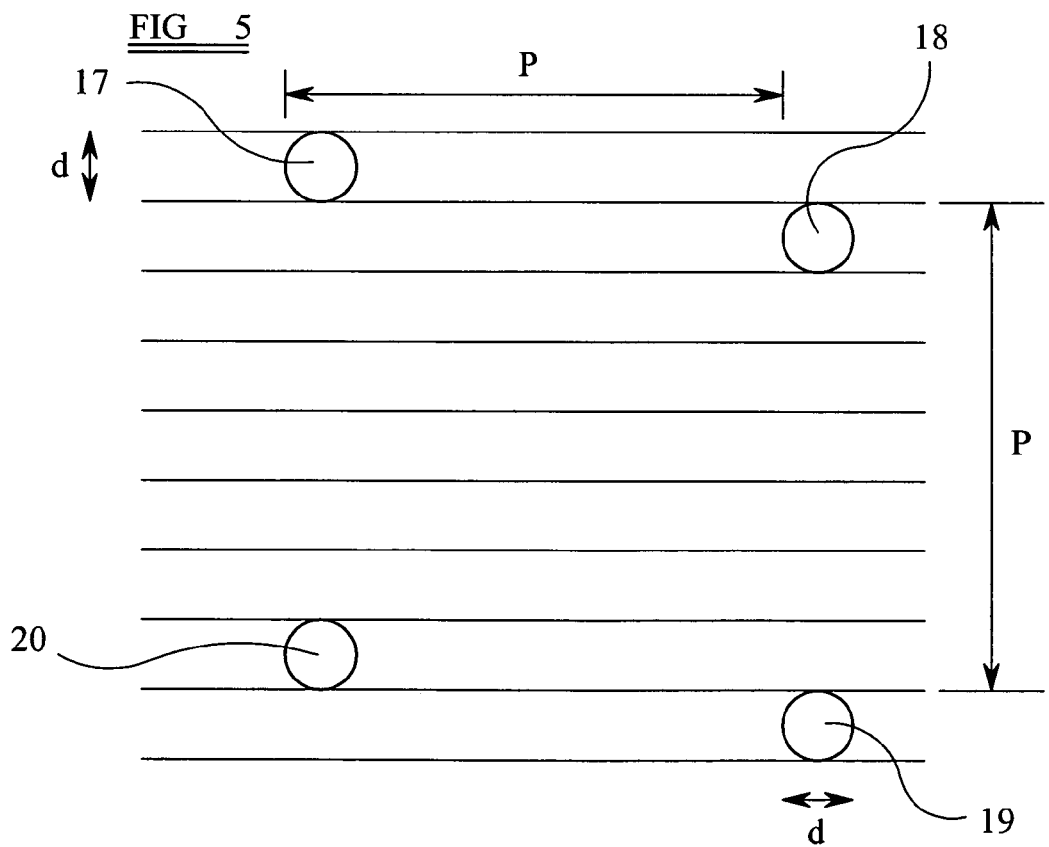

FIGS. 4 and 5 show disposition of spots of radiation projected by a lens arrays, according to various embodiments of the present invention.

Referring to FIG. 4, this drawing is illustrative of the relationship between the disposition of individual lenses in microlens array 9 of FIGS. 2 and 3 and a direction of displacement of substrate table 11 of FIG. 3. Again, the direction of displacement is represented in FIG. 4 by arrow 13. That direction is parallel to a line 14 which is inclined to a further line 15, which extends parallel to a row of the lenses in microlens array 9. Each lens projects light onto a different one of a rectangular array of spots one of which is identified by numeral 16. The lenses are arranged in a regular two dimensional array that is slightly inclined to direction 13 of substrate table movement, as shown such that the entire surface of substrate 10 can be exposed by appropriate control of the illumination beams delivered to the respective lenses by the respective elements 2 of contrast device 1. Each lens can in effect "write" a continuous line on the surface of substrate 10 and, given the disposition of the lenses relative to the direction of substrate movement, those lines are sufficiently close together to overlap.

In one example, to expose a selected two dimensional area of substrate 10, substrate 10 is advanced beneath microlens array 9 and the individual lenses beneath which the area to be exposed is positioned at any one time are illuminated by rendering the associated elements 2 of contrast device 1 reflective.

In FIG. 4, the continuous lines that can be written by individual lenses of microlens array 9 overlap to a significant extent in the direction perpendicular to the scan direction represented by arrow 13. In one example, such overlap is not necessary, and the full surface area of a substrate could be exposed using an arrangement in which projected spots that are adjacent in the direction perpendicular to the scan direction just touch, but do not overlap. Such an arrangement, which minimizes the total number of spots required to expose a given area, is desirable when, as is often the case, the production rate is limited by the rate at which the intensity of individual spots 16 can be changed.

In one example, individual spots are generally circular, but when used to expose pixels that are square some overlap between adjacent spots is required. With reference now to FIG. 5, a disposition of four spots 17, 18, 19 and 20 are arranged so that the continuous lines that can be written by each of the spots just touch, but do not overlap. Spots 17–20 have a pitch P and a diameter d. The scan direction is represented by the lines between which the four spots 17–20 are located. Thus spots 17 and 20 are projected by adjacent lenses in a row of lenses extending transverse to the scan direction, whereas the spots 17 and 18 are projected by adjacent lenses 8 in a column of lenses of microlens array 9. The column is inclined by a small angle to the scan direction. Spots 17 and 20 are separated by a distance equal to six times the diameter d of each spot. Thus, in order to fully expose substrate 10, each column of microlens array 9 has seven lenses.

It is to be appreciated that FIG. 5 is schematic, and is not representative of the scale of an actual apparatus. For example, microlens array 9 would typically have a lens pitch P of the order of about 150 micrometers, with each of the lenses projecting a spot (for example spot 17) with a diameter d equal to about 1.25 microns. The spot diameter d would typically be greater than the pixel track width to provide limited overlap between adjacent tracks, but for the purposes of illustration it is assumed that the spot diameter d is equal to the pixel track width. Assuming such dimensions apply, microlens array 9 has 120 rows of lenses spaced apart in the scan direction so as to ensure coverage of the full width of substrate 10 between spots that are adjacent in a common row extending transverse to the scan direction (for example spots 17 and 20 in FIG. 5).

In one example, to achieve appropriate resolution (spot size) at substrate 10, an appropriate numerical aperture is used. For example, this can be about 0.15. If the spacing between microlens array 9 (see FIG. 3) and substrate 10 is about 500 micrometers, the pitch P of the lenses in microlens array 9 will be at least about 150 micrometers. If a free working distance is, for example, about 1000 micrometers, the lens pitch P has to be greater, for example about 300 micrometers. A pitch P of 150 micrometers requires 120 lenses assuming a spot diameter d of about 1.25 micrometers at substrate 10. An array of lenses with a dimension of about 18000 micrometers in the scan direction (120×150). With a pitch P of about 300 micrometers, 240 rows of lenses extending transverse to the scan direction are used to fully cover the about 300 micrometer gap between adjacent lenses in each row. Thus, the number of rows of lenses is doubled as is their spacing, and therefore the length in the scan direction of micolens array 9 is quadrupled to about 720,00 micrometers (300×240).

If all the lenses in microlens array 9 were arranged in a single row extending transverse to the scan direction, exposure of the full length of substrate 10 would require transport of substrate 10 by that full length plus a very small distance corresponding to the scan-direction dimension of the row of spots. Given the number of rows of lenses required to expose the full width of substrate 10, the minimum scan direction is a function of the dimension in the scan direction of microlens array 9.

In addition, although the "footprint" of an individual array of lenses is relatively limited (for example 18,000 micrometers in the case of a free working distance of 500 micrometers, a pitch of 150 micrometers, and a spot diameter of 1.25 micrometers), in practice the footprint of an optical column, of which a lens array forms part, is larger than the footprint of the array itself given the presence of lenses and other components above the lens array itself, for example the components 6, 7 and 8 in FIG. 2.

FIG. 6 schematically represents an apparatus for exposing a substrate in a single pass of the substrate beneath an array of optical columns each of which comprises components as illustrated in FIGS. 2 and 3, according to one embodiment of the present invention. This embodiment illustrate an additional demand for space. A substrate 22 is displaced across a substrate table 21 in the direction indicated by arrow 23 beneath an array 24 of six optical columns 25. Each optical column 25 is illustrated as having a circular periphery representing the overall footprint of that column 25, within which there is an area 26 that is shaded that corresponds to an actual optical footprint of that column 25 upon substrate 22 as it is advanced beneath that column 25. It is to be appreciated that, although for the purposes of illustration only six optical columns 25 are shown in FIG. 6, in practice it can be the case that there are, for example, twenty five optical columns 25 arranged across the table 21.

FIG. 7 schematically represents the different areas of the substrate which can be illuminated by each of the optical columns shown in FIG. 6, according to one embodiment of the present invention. The optical footprints of the optical columns 25 are contiguous, such that the six optical columns 25 together can expose the full width of substrate 22. Broken lines represent the boundaries between the optical footprints of adjacent columns 25. Thus, each optical column 25 exposes a respective track 27 extending between a respective pair of broken lines 28, the tracks 27 covering the full width of substrate 22 between boundaries represented by full lines adjacent side edges 29 of substrate 22.

Within each track 27 the surface of substrate 22 can be considered as being made up of a series of pixels, each of which may or may not be exposed during scanning of substrate 22.

FIG. 8 schematically represents a pattern that can be desired to expose on a substrate using the apparatus of FIG. 6, according to one embodiment of the present invention. A row 30 of pixels are shown with alternate pixels shaded. Each row 30 of pixels corresponds to a track traversed by a single lens of one of optical columns 25. For example, pixel 31 is to be fully exposed ("white"), pixel 32 receives no radiation ("black"), and pixel 33 is fully exposed ("white"). A frequency at which the individually controllable contrast elements 2 (FIGS. 2 and 3) can change their state determines a rate at which the patterned beam projected onto substrate 22 can be changed. This sets a limit on a speed at which substrate 22 can be transported past optical column 25. If substrate 22 is traveling too fast, the contrast elements 2 cannot switch states sufficiently quickly to deliver the appropriate exposure to individual pixels. For example, assuming an update of 50 kilohertz (the number of times that the state of an individual contrast element 2 can be switched per second), and a pixel dimension of about 1.25 micrometers, then the maximum speed at which substrate 22 can be displaced is about 62,500 micrometers per second. This assumes that each pixel is exposed for a duration which is very short as compared with the speed at which substrate 22 is being transported, such that each exposure is delivered to a given pixel over a period during which substrate 22 is not displaced significantly.

In another example, when the contrast device 1 can only be updated at about 25 kilohertz, individual contrast devices cannot be updated sufficiently quickly to change their state as between adjacent pixels in a particular pixel track 30, and therefore one optical engine can only expose alternate pixels in a particular track 30. Therefore, either the scanning speed of substrate 22 has to be reduced to only about 31,250 micrometers per second or alternative arrangements must be made.

FIG. 9 schematically represents the position of two arrays of optical columns 25 each of the type shown in FIG. 6, according to one embodiment of the present invention. In this embodiment two arrays 24 of optical columns 25 each substantially identical to single array 24 shown in FIG. 6. Each array 24 is allocated to the exposure of alternate rows of pixels, such that for example in FIG. 8 one array would be responsible for the exposure of pixels 31 and 33, while the other array would be responsible for exposure of pixel 32 and the two pixels, other than pixel 32 which are adjacent to pixels 31 and 33. In this embodiment, a total scan range required to expose the full surface of substrate 22 is increased by a length in the substrate scanning direction of one of the optical column arrays 24.

In one example, a free working distance of about 500 micrometers and a pitch of about 150 micrometers, a microlens array dimension in the direction of scanning will be about 18,000 micrometers. In this example, to accommodate optical components other than the microlens array 9, adjacent optical columns 25 have to be offset in the scanning direction as represented in FIGS. 6 and 9. As a result, each optical column 25 can occupy a relatively large distance in the scanning direction, for example, about 100,000 micrometers. Thus, with the arrangement shown in FIG. 6, and substrate 22 with a dimension in the scanning direction of about 2 meters, the total scan range required to expose the full substrate will be about 2.1 meters. With the arrangement shown in FIG. 9, the total scan range will be 2.2 meters. Thus with each additional optical column array 24 an additional 0.1 meters is added to the scan range.

In this embodiment, an increase in the size of the substrate table and the overall footprint of the apparatus can result. With increasing size comes increasing cost and difficulty with regard to maintaining stable process conditions across the scan range. In some circumstances, it can be impossible to upgrade an existing apparatus to accommodate an increased scanning range simply by adding extra arrays of optical columns.

FIG. 10 schematically represents a scan range to expose a full substrate 34 using the apparatus of FIG. 9, according to one embodiment of the present invention. This embodiment shows the effect of adding an extra array of optical engines 36,37 to increase the required scan range. In this embodiment, substrate 34 has a length L as represented by arrow 35 and two arrays of optical columns 36 and 37 are provided, each with a length 1 represented by arrows 38 and 39. Substrate 34 has to be moved from the position shown in the upper half of FIG. 10 to the position shown in the lower half of FIG. 10. The total displacement is therefore L+2l. If substrate 34 only had to move beneath a single array of optical columns, for example array 36, the distance that substrate 34 would have to be displaced would be L+l. Thus, in order to double the speed at which substrate 34 can be displaced, it is necessary to increase the scan range from L+l to L+2l. Therefore, the throughput is not doubled by doubling the number of optical columns and doubling the speed of displacement of substrate 34.

FIG. 11 schematically represents one embodiment of the present invention incorporating two groups of optical columns 36,37 with the groups of optical columns 36, 37 being spaced apart in a scanning direction. The two arrays of optical columns 36 and 37 are provided to expose substrate 34, each of the columns 36 and 37 exposing a respective generally rectangular area of substrate 34 with the two generally rectangular areas being contiguous.

FIG. 12 represents a total scan range that substrate 34 has to move in order to expose the whole substrate, according to one embodiment of the present invention. Again, arrow 35 represents the length L of the substrate 34 and arrows 38 and 39 represents lengths, in the scan direction, of the arrays of optical columns 36 and 37. The upper half of FIG. 12 shows substrate 34 at the beginning of a scan, and the lower half of FIG. 12 shows substrate 34 at the end of the scan. It is to be appreciated that, in order for each of the generally rectangular areas of the substrate 34 to move beneath one of the arrays of optical columns 36, 37, substrate 34 is be displaced by a distance represented by arrow 40, that is by a distance equal to (L+2l)/2. Thus, as compared with the arrangement of FIG. 9, the speed of substrate displacement is halved, as is the displacement distance.

In one example, given an update rate for the pattern imparting contrast devices of about 12.5 kilohertz, a pixel size of about 1.25 microns, a substrate with about a 1 meter length in the scan direction, and an optical column array with a length in the scan direction of about 100,000 microns, then the maximum speed at which a substrate can be moved past the structure shown in FIG. 9 would be (1,000,000+100,000)/(1.25×12500)=about 70.4 seconds. If a second row of optical columns is added as shown in FIG. 9, the time taken to scan the substrate will be (1,000,000+200,000)/(2× 1.25×12500)=about 38.4 seconds.

To achieve a full scan in 38.4 seconds, the velocity of the substrate assuming a constant speed over the full exposure process will be 0.03125 meters per second.

In contrast, with two arrays of optical columns 36, 37 arranged as shown in FIG. 11, the time taken to expose the full substrate will be (500,000+100,000)/1.25×12500 which equals about 38.4 seconds. Thus, the time taken for a single scan is exactly the same as in the case of FIG. 9. However, the total displacement of substrate 34 during the scanning process is halved, as is the substrate velocity.

FIG. 13 schematically represents a scan range required to expose a full substrate using three groups of optical columns that are juxtaposed, according to one embodiment of the present invention. Three arrays of optical columns 41, 42 and 43 arranged to expose a substrate 44, a dimension 45 indicating the total scan range.

FIG. 14 schematically represents the scan range required to expose a full substrate using three groups of optical columns with the three groups being spaced apart in a scan direction, according to one embodiment of the present invention.

In FIG. 13, optical column array 41 exposes every third pixel along the length of substrate 44, while in FIG. 14 optical column 41 exposes each pixel of a generally rectangular area occupying a left hand third of substrate 44. Thus, for an identical scan duration in FIG. 14, the substrate scan speed and substrate displacement are reduced by a factor of three as compared with FIG. 13.

In the examples of the invention represented in FIGS. 12 and 14, individual arrays of optical columns are equally spaced apart along the length of the scan range with a pitch equal to L/N, where L is the length of the substrate to be exposed and N is the number of groups of optical columns. It is possible, however, to have groups of arrays of optical columns arranged along the direction of scan.

FIG. 15 schematically represents a scan range required to expose a full substrate using four groups of optical columns, according to one embodiment of the present invention. In this embodiment, the four optical column arrays arranged adjacent each other so as to be able to scan a substrate 50. An upper half of FIG. 15 shows substrate 50 as its leading edge just reaches an optical column array 46, and a lower half shows a trailing edge of substrate 50 as it just leaves the trailing end of an optical column array 49.

FIG. 16 schematically represents a scan range required to expose a full substrate using an apparatus in which four groups of optical columns are provided, the four groups being arranged in two pairs spaced apart in the scan direction, according to one embodiment of the present invention. This in contrast to FIG. 15, in FIG. 16, equivalent optical column arrays 46, 47, 48 and 49 are arranged in two pairs, a upper half of FIG. 16 showing substrate 50 just before the beginning of a scan, and a lower half of FIG. 16 showing substrate 50 immediately after the scan.

Whereas in FIG. 16 the scan range as represented by arrow 51 is equal to the overall length in the scan direction of substrate 50 plus four times the length in the scan direction of each of the optical column arrays, in FIG. 16 the scan range is indicated by arrow 52 and is equal to half the length of the scan range 51 in FIG. 15. Once again, for a given throughput, the scan range and speed is halved in the case illustrated in FIG. 16 as compared with the case illustrated in FIG. 15.

FIGS. 12, 14 and 16 assume that each of the spaced-apart groups of optical columns exposes a respective one of a series of contiguous generally rectangular areas on the substrate, the contiguous areas having mutual boundaries defined by straight lines extending parallel to the leading and trailing edges of the lens arrays such as the lens array shown in FIG. 4. With such an arrangement, each of the generally rectangular areas is displaced relative to the optical columns by a distance equal to the length of the rectangle in the scan direction plus the width of the optical column group in the scan direction. An alternative approach is possible in which the boundaries between adjacent contiguous areas to be exposed by adjacent groups of optical columns have a saw-tooth shape. This is possible because of the distribution of lenses in the optical columns, as schematically represented in FIG. 4, and as further described below with reference to FIG. 17.

FIG. 17 illustrates a saw-toothed boundary between areas of a substrate exposed by adjacent projection systems, according to one embodiment of the present invention. Assuming that a portion of substrate is being transported in the direction of arrow 53 beneath an array of lenses, such as schematically represented in FIG. 4, but having many more lenses than are depicted in FIG. 4, then line 54 represents the track of the lens at the top left hand corner of the array and line 55 represents the track of the lens at the bottom right hand corner of the array. Line 56 represents the position in the scan direction of the bottom left hand lens of the array, and line 57 represents the position in the scan direction of the top right hand lens of the array. The shaded area 55 represents an area of the substrate that is exposed by one group of optical columns, and the unshaded area 59 represents an area of the substrate that is exposed by the adjacent group of optical columns. The boundary between these two areas is saw-tooth shaped. Thus, the areas exposed by adjacent groups of optical columns overlap in the scan direction, with each area having a main generally rectangular area and an end portion with a saw-tooth edge, the end section having a length in the scanning direction equal to the length in the scanning direction of each group of projection systems.

FIGS. 18 and 19 illustrate adopting a boundary as illustrated in FIG. 17, according to embodiments of the present invention. This can result in desired number of groups of optical columns required to achieve a particular throughput.

FIG. 18 corresponds to FIGS. 11 and 12, in which two groups of optical columns are used to expose respective generally rectangular areas of the substrate. In FIG. 18, optical column group 60 is used to expose generally rectangular shaded area 61 extending from the left hand side of the group 60, and optical column group 62 is used to expose generally rectangular shaded area 63 extending from the left hand side of group 60 to the left hand side of group 62.

FIG. 19 represents the case as explained with reference to FIG. 17, in which a section of the substrate extending in the scan direction is exposed by both of the optical column groups 60 and 62. Optical column group 60 is used to expose part of the substrate areas 64 beneath group 60 and substrate areas 65 extending to the left of group 60. Optical column group 62 is used to expose part of substrate are 64 beneath group 60 and substrate area 66 extending to the right of group 60.

In the case illustrated in FIG. 18, in some circumstances the number of optical column groups required to achieve a given throughput can be greater than the number required in the case illustrated in FIG. 19. This difference is explained further below.

If there is only one group of optical columns, as in the case illustrated for example in FIG. 10, the number of optical columns required in the scan direction can be expressed as follows:

$$N_{oc} = \frac{L_s + L_{ocg}}{L_p \cdot f \cdot ET}$$

where:

$N_{oc}$=number of optical columns $L_s$=length of the substrate in the scan direction $L_{ocg}$=length of the optical column group in the scan direction $L_p$=length of each pixel to be exposed in the scan direction f=maximum frequency at which individual pixels can be addressed ET=the throughput, that is the time within which a full substrate has to be exposed.

$$L_{ocg} = N_{oc} \cdot L_{oc}$$

where $L_{oc}$ is the length of one optical column in the scan direction, and therefore:

$$N_{oc} = \frac{L_s}{L_p \cdot f \cdot ET - L_{oc}}$$

$N_{oc}$ is an integer. Assuming a throughput time ET of about 29 seconds, an addressing frequency of about 10 kHz, a substrate length $L_s$ of about 1 m, and optical column length $L_{oc}$ of about 0.1 m, and a pixel length $L_p$ of about 1 µm, then to achieve the target throughput requires about 5.26 optical columns, which in practice requires six optical columns.

Separating the optical columns as depicted in FIG. 18 into two groups of three would result in a substrate length to be exposed by each group of $L_s$=0.5. Thus, each group would require about 2.63 optical columns (half 5.26), that is in practice three optical columns. Thus, for the given throughput, there would still be a need for a total of six optical columns.

In the case as illustrated in FIG. 19, in which a section of the substrate is exposed by both of the two groups of optical columns, the equation determining the number of optical columns required to achieve a given throughput is different from that above as follows:

$$N_{oc} = \frac{L_s + L_{ocg}/N}{L_p \cdot f \cdot ET}$$

where N=number of groups of optical engines. The above equation can be simplified to:

$$N_{oc} = \frac{L_s}{L_p \cdot f \cdot ET - L_{oc}/N}$$

If two groups of optical engines are provided, then:

$N_{oc}$=4.17

Thus each group would require about 2.09 optical columns, which is substantially less than the 2.63 required with an arrangement, such as that illustrated in FIG. 18, but still would, in practice, require three optical columns per group. If, however, the optical columns were arranged in four groups, the above equation indicates:

$N_{oc}$=3.77

Thus, given four optical columns equally spaced apart in the scan direction with adjacent columns exposing overlapping areas of the substrate, a throughput can be achieved which requires six optical columns, if the optical columns are all arranged in a single group, or six optical columns if the optical columns are equally spaced apart, but do not expose overlapping areas of the substrate. This ability to reduce the number of optical columns required to achieve a given throughput is a significant additional result to the reduction in scan distance achieved as described above.

It will be appreciated that in an arrangement, such as that illustrated in FIG. 18, the groups of optical columns can be spaced apart with a pitch equal to L/N, where L is the length of the substrate to be exposed and N is the number of optical column groups. In contrast, in an arrangement such as that illustrated in FIG. 19, the group of optical columns are spaced apart with a pitch of (L+1)/N.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents. It is to be appreciated that only the Detailed Description section is intended to be used to interpret the appended claims, and not the Summary and Abstract sections of this document.

What is claimed is:

1. A lithographic apparatus comprising:
an illumination system that supplies a plurality of beams of radiation;
an array of individually controllable elements that pattern said plurality of beams of radiation;
a plurality of projection systems that project respective ones of the patterned beams onto a substrate, each of the projection systems comprising an array of lenses arranged so that each lens in the array of lenses directs a part of the respective patterned beams towards a respective target area on the substrate; and
a displacement system that causes relative displacement between the substrate and the projection systems, such that the respective patterned beams are scanned across the substrate in a predetermined scanning direction,
wherein the projection systems are arranged in projection system groups, such that lenses in the array of lenses of different projection system groups direct parts of different ones of the patterned beams to different one of the respective target areas of the substrate that are aligned in the scanning direction,
wherein the projection system groups are spaced apart in the scanning direction, such that each of the projection system groups scans the respective ones of the patterned beams across a respective area of the substrate as the substrate and the projection systems are displaced relative to each other, and
wherein the respective areas being scanned by the respective ones of the patterned beams from respective ones of the projection system groups that are adjacent to each other in the scanning direction are contiguous.

2. The apparatus of claim 1, wherein each of the contiguous areas is generally rectangular.

3. The apparatus of claim 2, comprising:
N of the projection system groups are distributed in the scanning direction with a pitch of L/N, where L is the length of the substrate to be exposed.

4. The apparatus of claim 1, comprising:
two of the projection system groups,
wherein each of the two groups comprises an array of the projection systems, each of the arrays of the projection systems exposing half of a length of the substrate in the scan direction, and
wherein a pitch between the two groups is half of the length of the substrate to be exposed.

5. The apparatus of claim 4, wherein each of the two groups comprises two of the arrays of the projection systems, each of the two arrays exposing the respective target areas of the substrate extending across a width of the substrate.

6. The apparatus of claim 1, comprising:
three of the projection system groups, wherein each of the groups comprises an array of the projection systems that expose one third of a length of the substrate in the scan direction, and the pitch between each of the groups is one third of the length of the substrate to be exposed.

7. The apparatus of claim 1, wherein each of the contiguous areas has a generally rectangular main portion and at least one end portion extending in the scanning direction from the main portion, the at least one end portion of the contiguous areas having a saw-toothed shape with teeth of the at least one end portion overlapping the teeth of the contiguous areas.

8. The apparatus of claim 7, wherein each of the at least one end portions has a length in the scanning direction equal to length in the scanning direction of each of the groups of the projection systems.

9. The apparatus of claim 8, comprising:
N of the groups of the projection systems that are distributed in the scanning direction with a pitch of (L+1)/N, wherein L is a length of the substrate and l is a length in the scanning direction of each of the groups of the projection systems.

10. The apparatus of claim 1, wherein:
the displacement system causes displacement of the substrate; and
the projection systems are stationary.

11. The apparatus of claim 1, wherein:
each of the arrays of lenses projects spots the patterned beam that expose tracks on a surface of the substrate; and
the tracks exposed by one of the arrays of lenses are contiguous.

12. A device manufacturing method, comprising:
patterning each of a plurality of beams using arrays of individually controllable elements;
projecting the patterned beams onto a substrate; and
displacing the substrate relative to the patterned beams, such that the patterned beams are scanned across the substrate in a predetermined scanning direction; and
directing the patterned beams towards the substrate using an array of lenses that are arranged such that each lens in the array of lenses directs a respective part of a respective patterned beam towards a respective target area on the substrate,
arranging the projection systems in groups, such that each of the lenses in the arrays of lenses of different ones of the projection system groups direct parts of different ones of the patterned beams to different areas of the substrate that are aligned in the scanning direction; and
spacing the projection system groups apart in the scanning direction, such that each of the projection system groups scans the patterned beams across the areas of the substrate as the substrate and the projection systems are displaced relative to each other, the respective areas scanned by the patterned beams from the projection system groups that are adjacent to each other in the scanning direction are contiguous.

13. The method of claim 12, further comprising making the contiguous areas substantially rectangular.

14. The method of claim 13, further comprising:
distributing N of the projection system groups in the scanning direction with a pitch of L/N, where L is a length of the substrate.

15. The method of claim 12, further comprising:
spacing two of the projection system groups apart in the scanning direction with a pitch of half of a length of the substrate; and
displacing the substrate relative to the projection system groups, such that one half of the substrate is displaced across a full width of one of the projection system groups and the other half of the substrate is displaced across the full width of the other the projection system groups.

16. The method of claim 15, further comprising:
using two arrays of the projection systems in each of the groups, the two arrays of projection systems of each the groups exposing a respective half of the substrate and each of the two arrays of the projection systems exposing alternate pixel areas in the scanning direction of the respective part of the substrate.

17. The method of claim 12, further comprising:
spacing three of the groups of the projection systems apart in the scanning direction with a pitch of one third of a length of the substrate; and
displacing the substrate relative to the groups, such that a respective one third of the substrate is displaced across a full width of each group.

18. The method of claim 12, wherein:
each of the contiguous areas has a generally rectangular main portion and at least one end portion extending in the scanning direction from the main portion, the at least one end portion of each of the contiguous areas having a saw-toothed shape with teeth of one of the at least one end portion overlapping teeth of the contiguous areas.

19. The method of claim 18, wherein each of the at least one end portion has a length in the scanning direction equal to a length in the scanning direction of each of the groups of the projection systems.

20. The method of claim 19, further comprising:
distributing N of the groups of the projection systems in the scanning direction with a pitch of (L+1)/N, wherein L is a length of the substrate and 1 is the length in the scanning direction of each of the groups of the projection systems.

21. The method of claim 12, further comprising:
displacing the substrate; and
making the projection systems stationary.

22. The method of claim 12, further comprising:
projecting spots of the patterned beams using each of the arrays of lenses to expose respective ones of the contiguous tracks on the surface of the substrate.

* * * * *